US010982944B1

(12) United States Patent
Bhandari et al.

(10) Patent No.: US 10,982,944 B1
(45) Date of Patent: Apr. 20, 2021

(54) ULTRA-LOW POWER SENSOR SYSTEMS FOR VIBRATION AND MOTION DETECTION

(71) Applicant: mCube, Inc., San Jose, CA (US)

(72) Inventors: Sanjay Bhandari, San Jose, CA (US); Tony Maraldo, San Jose, CA (US)

(73) Assignee: mCube, Inc., San Jose, CA (US)

( * ) Notice: Subject to any disclaimer, the term of this patent is extended or adjusted under 35 U.S.C. 154(b) by 157 days.

(21) Appl. No.: 15/917,505

(22) Filed: Mar. 9, 2018

Related U.S. Application Data

(60) Provisional application No. 62/469,458, filed on Mar. 9, 2017.

(51) Int. Cl.
G01B 5/004 (2006.01)
G01P 15/18 (2013.01)
B81B 7/02 (2006.01)

(52) U.S. Cl.
CPC ............ G01B 5/004 (2013.01); B81B 7/02 (2013.01); G01P 15/18 (2013.01); B81B 2201/0235 (2013.01); B81B 2201/0242 (2013.01); B81B 2201/0264 (2013.01)

(58) Field of Classification Search
CPC ......... G01L 1/18; G01L 17/00; G01L 9/0052; B33Y 80/00; B29D 30/0061; B29D 2030/0077; B60C 23/20; B60C 23/04; B60C 23/0493; B60C 23/064
See application file for complete search history.

(56) References Cited

U.S. PATENT DOCUMENTS

| 10,366,550 | B2* | 7/2019 | Lawrie-Fussey | H04W 4/46 |
| 2006/0124171 | A1* | 6/2006 | Ghazarian | F17D 5/06 137/312 |
| 2006/0267756 | A1* | 11/2006 | Kates | H04B 1/69 340/521 |
| 2007/0289635 | A1* | 12/2007 | Ghazarian | F17D 5/06 137/312 |
| 2008/0155285 | A1* | 6/2008 | Viitaniemi | G06F 1/3203 713/320 |
| 2011/0066297 | A1* | 3/2011 | Saberi | F16K 31/046 700/287 |
| 2013/0103204 | A1* | 4/2013 | Stefanski | G06F 1/3231 700/276 |
| 2013/0223317 | A1* | 8/2013 | Kudo | H04W 52/0206 370/311 |

(Continued)

Primary Examiner — Nimeshkumar D Patel
Assistant Examiner — Gedeon M Kidanu
(74) Attorney, Agent, or Firm — Richard T. Ogawa; Ogawa P.C.

(57) ABSTRACT

A method for a system includes applying power to a MEMS device while inhibiting applying power to a processor, thereafter determining first sensed data with the MEMS device in response to first event data, when the first sensed data exceeds a first threshold, determining second sensed data with a second MEMS device in response to second event data, when the second sensed data exceeds a second threshold, applying power to the processor, determining with the processor whether a seismic event is occurring in response to the first and the second sensed data, directing with the processor, an electronically-controllable mechanism to shut-off a utility supply, in response to the seismic event being determined.

20 Claims, 5 Drawing Sheets

(56) References Cited

U.S. PATENT DOCUMENTS

| | | | | |
|---|---|---|---|---|
| 2014/0183386 A1* | 7/2014 | Ravid | ............... | G01F 1/115 251/129.01 |
| 2014/0343736 A1* | 11/2014 | Meyer | ............... | G05D 7/0635 700/283 |
| 2016/0069772 A1* | 3/2016 | Gnoss | ............... | G05D 7/0635 700/282 |
| 2020/0072661 A1* | 3/2020 | Forster-Knight | ...... | G01H 11/08 |

\* cited by examiner

ULTRA-LOW POWER SENSOR SYSTEMS FOR VIBRATION AND MOTION DETECTION

CROSS-REFERENCE TO RELATED APPLICATIONS

The present invention claims priority to and is a non-provisional of U.S. Patent App. No. 62/469,458 filed Mar. 9, 2017. The application is incorporated by reference herein, for all purposes.

BACKGROUND

The present invention is directed towards ultra-low powered sensor systems for event detection. More specifically, the present invention is directed towards ultra-low power detection of seismic events and inhibiting utility services in response thereto. Seismic events may include earthquakes, tidal waves, flooding, accidents, terrorist activities or the like.

Complex systems such as those for seismic event detection typically require many data analysis operations before physical perturbation events (e.g. vibrations, tilts, etc.) can be properly classified as a seismic event or a non-event (e.g. truck passing by). Typically, because these systems require a processor or microcontroller to perform signal and data analyses, these systems have very high power consumption.

The inventors of the present invention have determined that because a great majority of physical perturbations sensed by these monitoring systems are not associated with seismic events and instead are false alarms, a great majority of power consumed by such systems is effectively wasted. Because of the high energy consumption, such systems are thus not widely usable in environments requiring low maintenance or low service (e.g. frequent battery replacement in remote locations).

In addition, it is extremely difficult to access and replace batteries or power for end users of such equipment. Hence these systems require ultra-low power such that on a single, most times, non-rechargeable battery, the complete electronic system should operate for an extended period of time of 10-12 years.

What is desired are improved event detection systems that reduce the drawbacks mentioned above.

SUMMARY

The present invention is directed towards ultra-low powered sensor systems for event detection. More specifically, the present invention is directed towards ultra-low power detection of seismic events and inhibiting utility services in response thereto. Seismic events may include earthquakes, tidal waves, flooding, accidents, terrorist activities or the like.

Various embodiments provide a system wherein a processing unit is placed in an ultra low power state where power is inhibited from processing logic, while interrupts are monitored. Additionally, a first MEMS sensor operates in a low power mode to monitor for physical perturbations, e.g. tilt, sudden accelerations, etc. When the sensed data from the first MEMS sensor exceeds a threshold, typically a second MEMS sensor is powered-up and continues to monitor of physical perturbations. The type of sensed data for the second MEMS sensor may be the same type as the first MEMS sensor, or different. When the sensed data from the second MEMS sensor exceeds another threshold, it generates an interrupt signal. In response to the interrupt, power may be provided to the processing logic, and the processing retrieves the sensed data from the first and second MEMS sensors. Typically, based upon more computationally intensive operations, the processing unit may determine whether the physical perturbations are associated with a seismic event, or not. In various embodiments, if a seismic event is detected, the processing unit may control an electronically controlled valve or switch of a utility supply. Accordingly, the water, gas, electricity, propane, and the like supply is inhibited from being distributed to a utility consumer (e.g. business, residential, etc.).

According to one aspect of the invention, a system is coupled to a utility shut-off mechanism. A device may include a MEMS device configured to receive a first physical perturbation and to output first sensed signals in response thereto, wherein the MEMS device is configured to receive a second physical perturbation and to output second sensed signals in response thereto, wherein the first MEMS device is configured to determine whether the first physical perturbation exceeds a first threshold, and wherein the MEMS device is configured to determine whether the second physical perturbation exceeds a second threshold in response to the first physical perturbation exceeding the first threshold. A system may include a memory coupled to the MEMS sensor and configured to store the first sensed signals and the second sensed signals, and a processor coupled to MEMS device and to the memory, wherein the processor is configured to determine a seismic event condition in response to the first sensed signals and to the second sensed signals and in response to the second physical perturbation exceeding the second threshold, wherein the processor is configured to direct the utility shut-off mechanism to activate in response to the seismic event condition. In various embodiments, the processor is in a first power consumption state before the MEMS device determines that the second physical perturbation exceeds the second threshold, and the processor is in a second power consumption state after the MEMS device determines that the second physical perturbation exceeds the second threshold, wherein the second power consumption state of the processor is higher than the first power consumption state of the processor.

According to another aspect of the invention, a method for a system coupled to a utility shut-off mechanism is described. A technique may include applying operating power to a MEMS device while inhibiting operating power from being supplied to a processor, receiving with the MEMS device a first physical perturbation and outputting first sensed signals in response thereto, and determining with the MEMS device whether the first sensed signals exceed a first threshold. A process may include receiving with the MEMS device a second physical perturbation and outputting second sensed signals in response thereto, determining with the MEMS device whether the second sensed signals exceed a second threshold, and storing in a memory the first sensed signals and the second sensed signals. A method may include applying the operating power to the processor in response to the second sensed signals exceeding the second threshold, processing with the processor the first sensed signals and the second sensed signals and determining an existence of a seismic event condition in response thereto, and directing with the processor the utility shut-off mechanism to activate in response to the seismic event condition.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION

In various embodiments of the present invention a novel seismic event monitoring system is disclosed that provides operating power to one or more sensors system to enable the system to detect events such as earthquakes, tidal waves, floods, explosions, etc.

Figure 1:
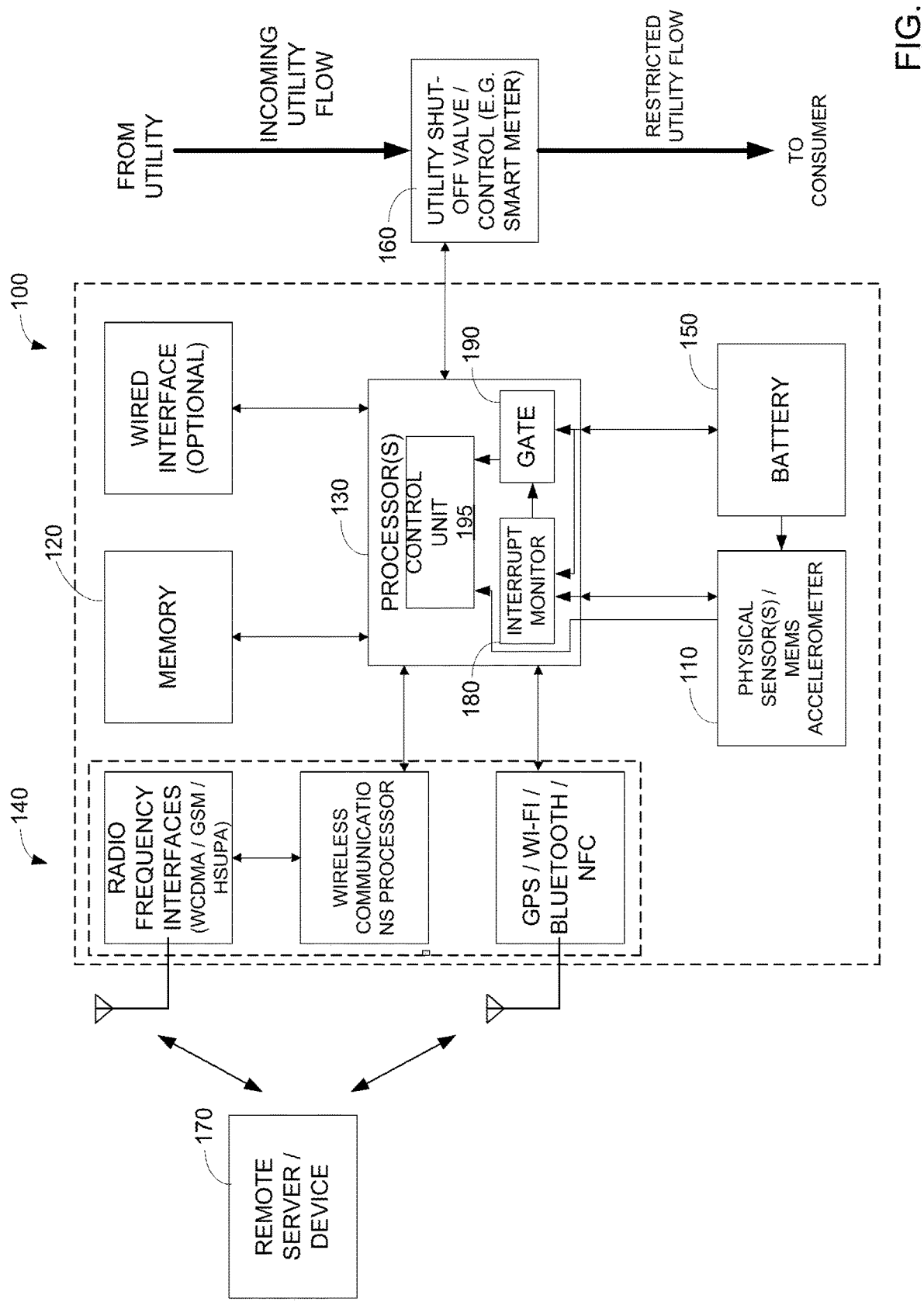
FIG. 1 is a simplified diagram an embodiment of the present invention.

FIG. 1 illustrates an embodiment 100 of the present invention include one or MEMS sensors 110, a memory 120, a processor 130, a communications module 140 and an internal power supply 150. The monitoring system is typically coupled to an electronically controllable shut-off valve or switch 160. Some embodiments 100 may be stand-alone devices and some embodiments may be embodied within a smart utility meter, or the like.

Typical sensors 110 include MEMS-based accelerometers, but may include gyroscopes, magnetometers, or the like. In some examples, one or more sensors operate in ultra-low power states while awaiting physical perturbations, while other sensors, processors 130 (e.g. microcontrollers, state machines, etc.), communications modules 140 of the system 100 remain in an off-state or ultra-lower power state. Such techniques reduce over-all power consumption of monitoring systems 100.

In various embodiments, with advances in MEMS sensors such as those provided by mCube, the assignee of the present invention, MEMS sensors 110 can consume as little as few hundred nano-amps of power in ultra-lower power states. This low drain in power is characteristic of sleep and sniff modes developed by mCube. In various embodiments, when such MEMS sensor or sensors 110 detect certain types of characteristic physical perturbations, the sensed data is typically logged in memory 120, and depending upon threshold comparisons, operating power may be selectively provided to certain other portions of the system 100, discussed above.

In various embodiments, by greatly reducing the power consumed by seismic event monitoring systems 100, the monitoring system 100 may be able to operate for several years (e.g. 10 years) without an external power supply. In many cases, an internal power supply 150 may be used and include one or more sources, such as a battery, a capacitor, a solar panel, a turbine, low voltage supply, or combinations of the above. In various embodiments, the internal power supply 150 provides operating power to the processor 130 typically when certain physical perturbations meet defined thresholds.

In some embodiments, one or more MEMS sensors 110 may be used to analyze incoming data in multiple steps. In some embodiments, not all sensors are powered all the time, instead, a first sensor acts a gate to wake the next sensor. For example, once the first sensor determines that a physical perturbation event meets a first threshold or requirement, then the first sensor wakes a second sensor (but not the processor). In turn, once the second sensor (and sometimes also the first sensor) determines that a subsequent physical perturbation meets a second threshold, then the second sensor (and/or first sensor) may wake the processor. In various embodiments, these sensors can maintain a FIFO or other memory storage to fill series of consecutive measurements which can be used to store the sensed data, without the need to wake processor (e.g. MCU) 130.

In some embodiments, the MEMS sensors 110 may include one or more accelerometers, gyroscopes, magnetometers, pressure sensors, or the like to measure an amount of tilt and/or duration of tilt, a force applied other than gravity and/or duration of the force, and the like. In a first example, a single accelerometer measures tilt then force; and in another example, a first accelerometer measures tilt or force, then the first and a second accelerometer measure force or tilt; and the like. The sensor data may be stored in a FIFO buffer or other memory 120.

In various embodiments, the processor 130 may include a microprocessor, a microcontroller unit (MCU), a state machine, or the like. The processor 130 is configured to retrieve the sensor data stored in the FIFO or other memory 120, process the data according to one or more programmed algorithms, and determine whether a seismic event is occurring or not. As discussed above, the processor 130 is coupled to and control a utility shut-off valve 160 and a communications module 140 if it determines a seismic event is occurring.

In various embodiments, utility shut-off control 160 may be a natural gas shut-off, a water shut-off, an electricity shut-off, a propane shut-off, an electricity shut-off switch, or the like. In such embodiments, when a seismic event is detected, the system 100 directs the shut-off control 160 to cut-off the gas supply, water supply, the electricity supply, or the like. In some embodiments, the monitoring system 100 described above is incorporated within a smart utility meter system.

In some embodiments the communications module 140 communicates with a remote device or server 170, e.g. utility supplier, law enforcement, public safety, a user smart device (e.g. phone), or the like. Various communications mechanism may be used including Wi-Fi, Ethernet, Zig-Bee, Z-Wave, cellular, Bluetooth, or the like. If a seismic event is detected, the seismic data (e.g. tilt and duration, force and duration, processed data), service address, and the like may be provided to the remote server 170.

As illustrated in FIG. 1, processor 130 may include a number of sub modules, including an interrupt monitor 180, a power switch or gate 190, and a control unit. In various embodiments, interrupt monitor 180 is typically coupled to power supply 150 and to MEMS sensors 110. Control unit 195 is typically coupled to power supply 150 via gate 190, and gate 190 is controlled by interrupt monitor 180. In an ultra low power operating mode, operating power is provided from power supply 150 to MEMS sensors 110 and to interrupt monitor 180, but not necessarily control unit 195.

Depending upon the type of physical perturbations sensed by MEMS sensors 110, as described further below, MEMS sensors 110 may output one or more interrupt signals to interrupt monitor 180. Next, when interrupt monitor 180 senses the one or more interrupts, it activates gate 190. In response, gate 190 will couple power supply 150 to control unit 195, thereby providing operating power to control unit 195. As will be discussed below, in this higher power consumption state, perturbation data from MEMS sensors 110 is read and processed by control unit 195. In various embodiments, when only interrupt monitor 180 is powered, in a stand-by mode, processor 130 may consume on the order of 100 nanoamps. When control 195 is powered, operating mode, processor 130 may consume milliamps of current.

Figure 2A:
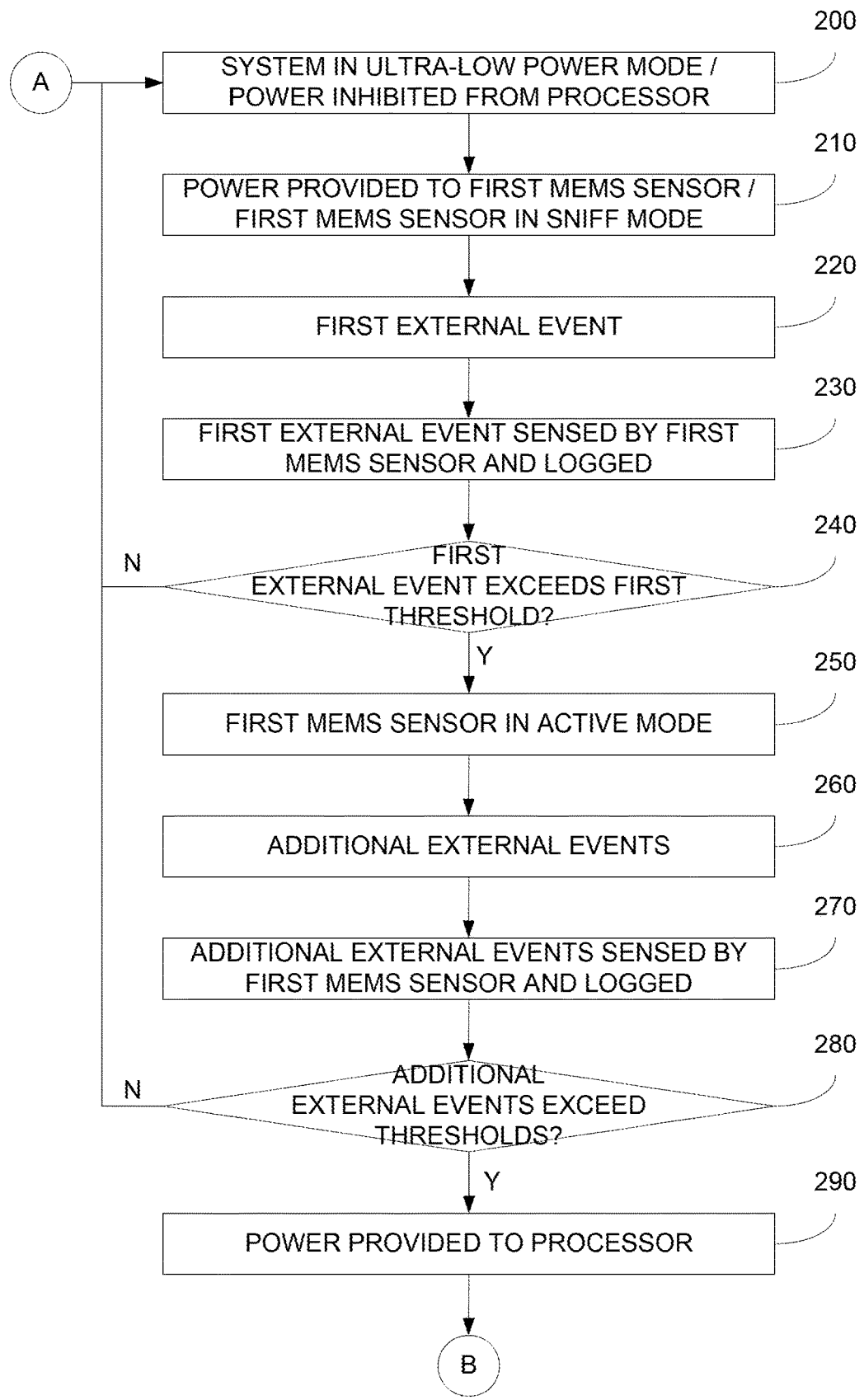
FIGS. 2A-B is a simplified block diagram of a process according to an embodiment of the present invention.
Figure 2B:
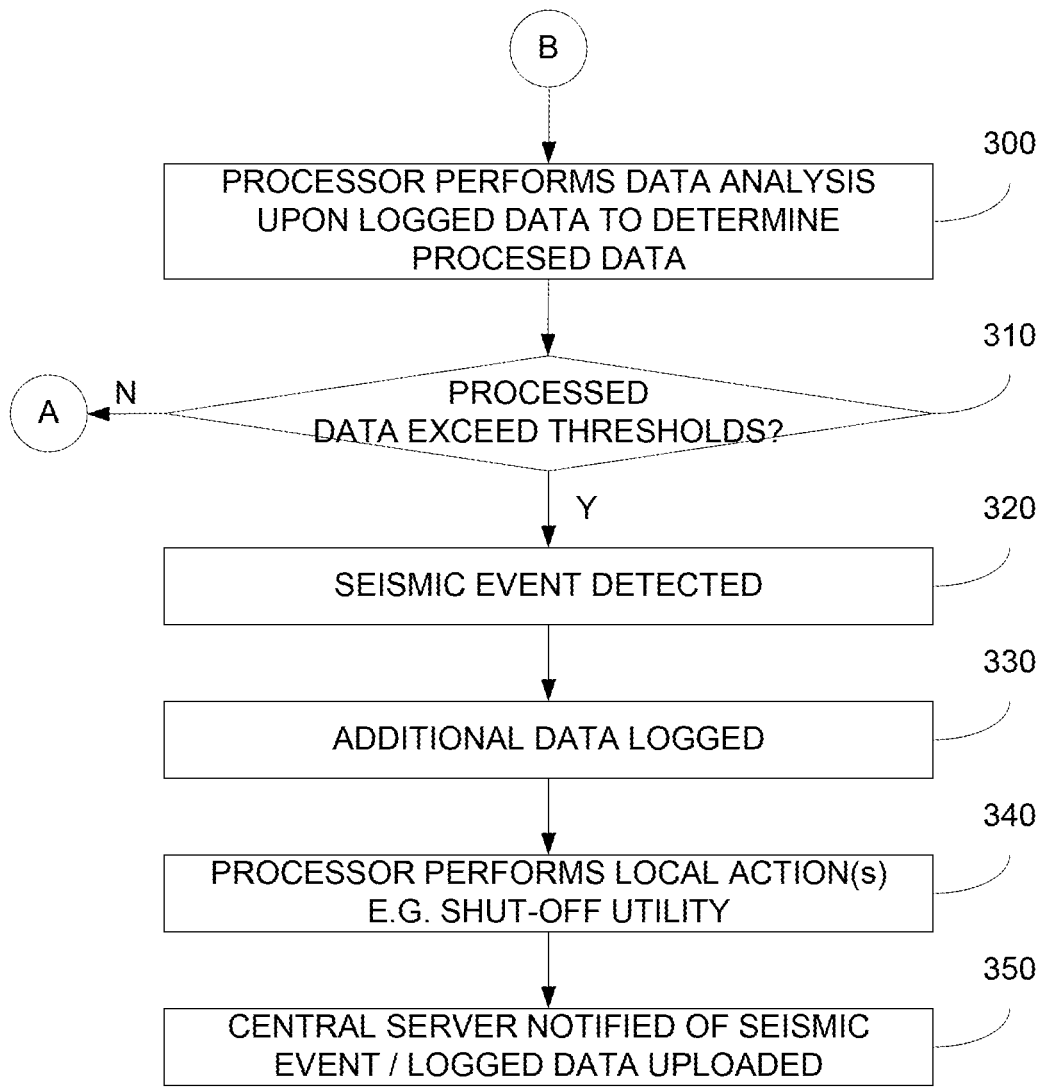

FIGS. 2A-B illustrates a more detailed diagrams of the operation of embodiments of the present invention. For example, in FIGS. 2A-B, the system is normally in an ultra-low power operating mode where power is provided to a MEMS sensor, step 200 and the MEMS sensor is in a lower operating power mode, step 210. In some examples, the MEMS sensor is in a sniff mode where it acquires data every 1 second, $\frac{1}{10}$ second, $\frac{1}{100}$ second, or the like, for example. Additionally, operating power is typically inhibited from the processor (e.g. control unit 195 via open gate 190) and the processor is in a low power/sleep mode.

Next, in response to a first event (physical perturbation), such as a device tilt, step 220, the MEMS sensor may measure the tilt and duration (e.g. 10 s of miliGs acceleration) of the system, step 230. In some embodiments, this tilt generally requires high precision, and the tilt is typically less than a few degrees. In this example, a determination is made if the tilt exceeds a first threshold (e.g. 1 degree for >0.1 second), step 240. In some embodiments, this loop may be performed n number of times, and the determination in step 240 may be based upon whether for a majority (e.g. +50%, +70%, +90% etc.) of the n number of times the threshold is exceeded. In another embodiment, this loop may be performed 2 or more times, and the determination in step 240 may be based upon whether the absolute value of the difference of data for two adjacent time periods exceeds a threshold. In an example, data for time periods 1, 2, 3 and 4 are respectively 10, 16, 5, 6, and the absolute value of the differences are: 6, 11 and 1. If the threshold is 5, two out of the three differences, 6 and 11, exceed the threshold. In this example, the determination in step 240 may be satisfied based upon two out of three.

In some embodiments, if the determination is made, the MEMS sensor may be placed in a higher power (e.g. active) mode, for example where it acquires data every ½ second, for example, step 250. In other embodiments, the MEMS sensor may remain in the lower power sniff mode and still perform the following steps 260-280. In the higher power mode, a second event (physical perturbation), step 260, such as vertical force or acceleration may be measured along with duration, step 270. In some embodiments, the vertical acceleration is compared to the acceleration of earth's gravity (e.g. 9.8 m/s$^2$), step 280. The power settings typically need to be different for these two sensing events. This can be accomplished by using a first ultra-low power sensor set in 'sniff' mode to detect & wake up after first occurrence of desired 'tilt' threshold on any axis. The onset of first event makes the first sensor monitor to measure follow-up events such as 'free fall'. In some examples, the event may be occurrence of a free fall (no force) within a period of one or two seconds. In one embodiment, this function can be accomplished by setting the sensor to count the number of times the acceleration is higher than set threshold of the event (such as free fall) within a period of time. As discussed above, this loop may be performed n number of times. Further, the determination in step 280 may be made based upon comparisons to a threshold for each data sample, or may be based upon differences between successive data samples, compared to a threshold. In various embodiments, it should be understood that the types of measurements during these first two phases may change according to experimental data.

In various embodiments herein, the perturbation signals determined by various MEMS sensors may be processed by combinatorial logic on chip, and/or in other embodiments, on logic external to the MEMS sensors and external to the processor. The on board or off-chip hardware logic may process the received data from one or more MEMS devices and/or make the determinations whether the thresholds are exceeded or not, as described above.

In one specific example, in the second loop or phase, if the vertical acceleration is less than 1 G within the predetermined amount of time, the system may determine a seismic event might be taking place, thus the processor is awakened for further data processing and analysis, step 290. In one embodiment, the MEMS sensor, or the like may generate an interrupt signal upon making the above determinations. In some embodiments, the MEMS sensor may also enter a higher power mode (wake mode) from the sniff mode, upon the determinization. The interrupt monitor, e.g. 180, monitors for interrupt signals, and wakes the MCU in response to the interrupts. More specifically, operating power may be provided to the processor; the processor may be wakened from a sleep mode; or the like. In one embodiment illustrated in FIG. 1, in this step, gate 190 is closed and power is provided from power supply 150 to control unit 195.

Next, the processor may retrieve sensed data from data buffers on the MEMS devices, e.g. FIFO buffers, and process the sensor data and analyze the resulting data, step 300. In various embodiments, the processing unit may process the sensor data, e.g. with a low-pass filter, or other filters to reduce noise and to determine whether there is a seismic event. If, based upon the processor analysis, the data exceeds a threshold, step 310, the system may determine that a seismic event is taking place, step 320. The processed data may be stored in a memory for further analysis, step 330. As discussed above, in response, the utility shut-off control may be directed to shut-off the utility service, step 340, and the system may transmit an indication of the seismic event and/or provide the processed data to a remote server, e.g. the utility, public safety, or the like, step 350.

Figure 3A:
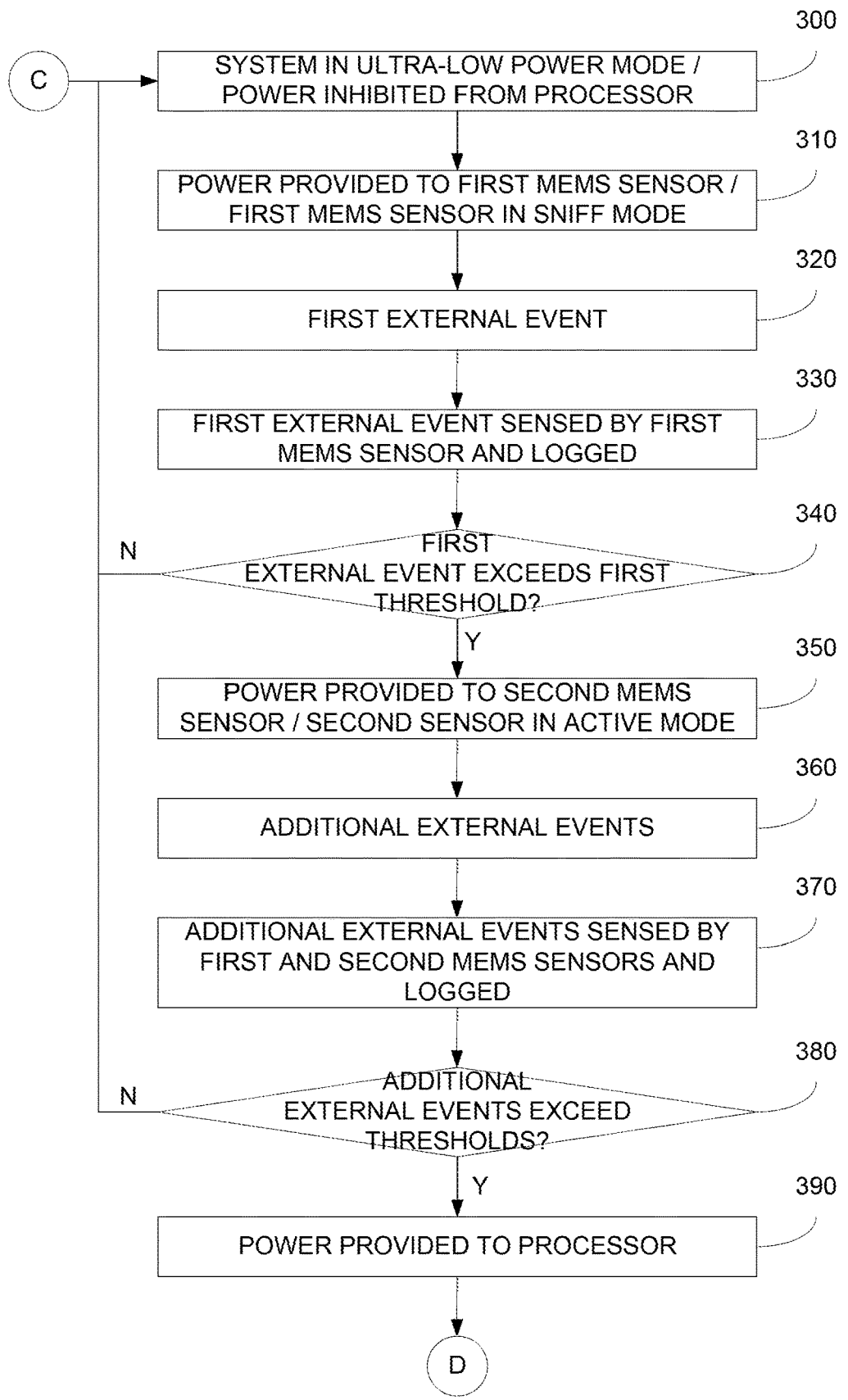
FIGS. 3A-B is a simplified block diagram of a process according to another embodiment of the present invention.
Figure 3B:
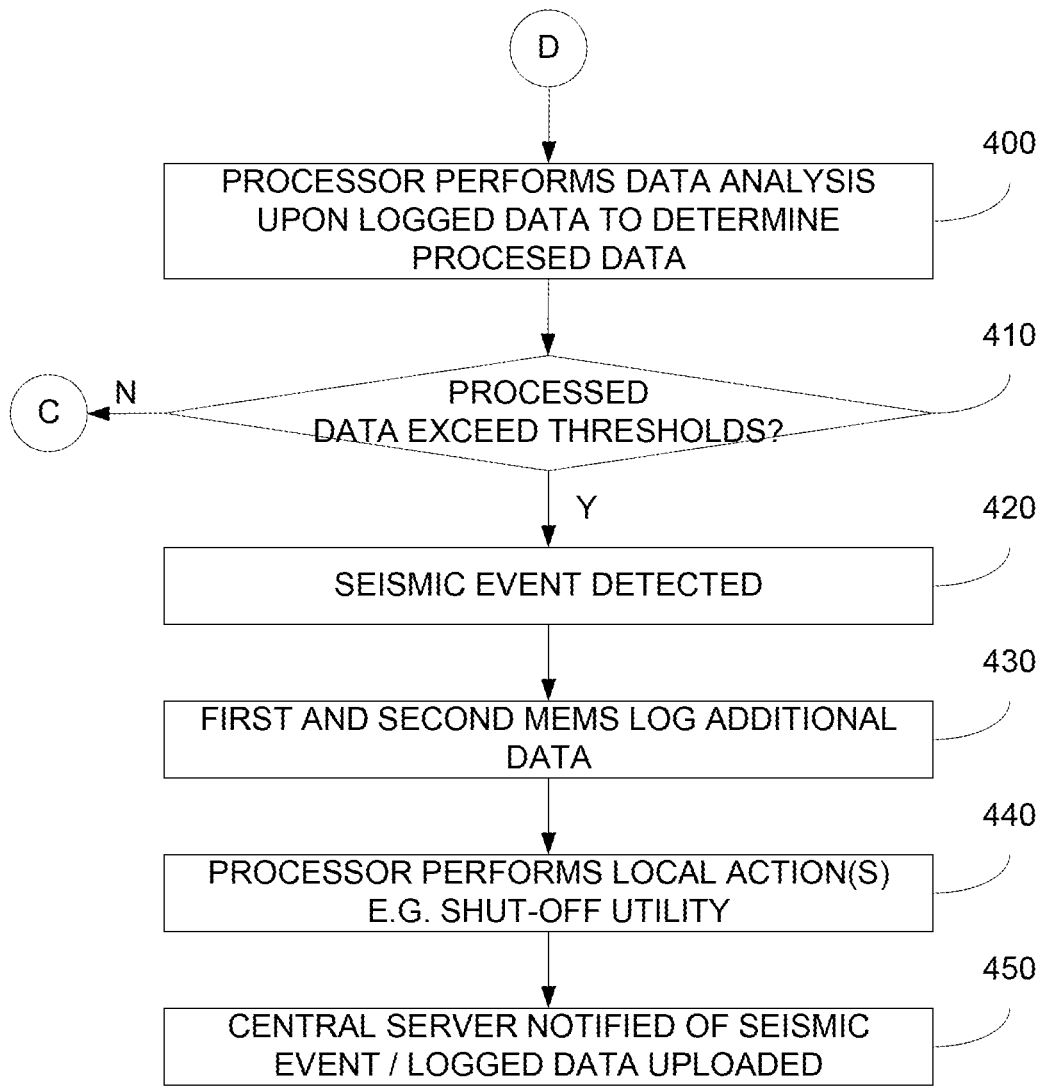

As illustrated in FIGS. 3A-B, in some embodiments, two or more MEMS sensors may be used and may operate similar to the embodiment illustrated in FIGS. 2A-B. For example, a first accelerometer may determine an amount of tilt in a first phase, and a second accelerometer may determine a number of zero G events per time period in a second phase. In FIG. 3A, a first MEMS sensor may be in an ultra low power mode, where power is in a low-power mode, step 400. Similar to the embodiment above, a gate 190 may inhibit power from reaching control unit 195 in this mode. The MEMS may also be in a low power mode and sample physical perturbations periodically, step 410. When a physical perturbation occurs, e.g. earthquake, heavy truck driving by, or the like, step 420, the first MEMS sensor senses data, step 430, and writes the data to a FIFO buffer.

In various embodiments, a determination is made as to whether the sensed data exceeds a threshold, step 440. As discussed above, various methods may be implemented for this first loop. For example, n number of sensed data may each be compared to a threshold, and the determination in step 440 is made if a majority of the sensed data exceed the threshold. As another example, successive sensed data are subtracted, and the difference is compared against a threshold, and the determination is made if a majority of the differences exceed the threshold.

After the determination is made is step 440, various embodiments initiate providing power to a second MEMS device, step 450. The second MEMS device may be utilized to measure the same type of physical perturbation as the first MEMS device (e.g. tilt) (at a different operating frequency), or may be utilized to measure another type of physical perturbation (e.g. acceleration). Next, as an additional physical perturbation occurs, step 460, the second MEMS device (and the first MEMS device) may record additional sensed data, step 470.

In various embodiments, a determination is then made as to whether the additional sensed data exceeds another threshold, step 480. As discussed above, various methods may be implemented for this additional loop. For example, m number of additional sensed data may each be compared to a threshold, and the determination in step 480 is made if a majority of the additional sensed data exceed the threshold. As another example, successive additional sensed data are subtracted, and the difference is compared against another threshold, and the determination is made if a majority of the differences exceed the threshold.

Similar to the embodiment discussed in FIGS. 2A-B, once the second determination is made, the processor is awakened for further data processing and analysis, step 490. In one embodiment, the MEMS sensor, or the like may generate an interrupt signal upon making the above determinations, and an interrupt monitor, e.g. 180, monitors for interrupt signals, and wakes the MCU in response to the interrupts. In one embodiment in this step, gate 190 is closed and power is provided from power supply 150 to control unit 195.

Next, the processor may retrieve sensed data from data buffers on the MEMS devices, e.g. FIFO buffers, and process the sensor data and analyze the resulting data, step 400. In various embodiments, the processing unit may process the sensor data, e.g. with a low-pass filter, or other filters to reduce noise and to determine whether there is a seismic event. If, based upon the processor analysis, the data exceeds a threshold, step 410, the system may determine that a seismic event is taking place, step 420. The processed data may be stored in a memory for further analysis, step 430. As discussed above, in response, the utility shut-off control may be directed to shut-off the utility service, step 440, and the system may transmit an indication of the seismic event and/or provide the processed data to a remote server, e.g. the utility, public safety, or the like, step 450.

In some examples, Micro-Electro Mechanical (MEMS) sensor or any other sensor output can also be shared across multiple Hardware systems or Application Specific IC (ASIC) that process the sensor information. A first set of hardware or ASIC processes information that verifies a first set of event detection. The second set of hardware processes the same or subsequent information to look for second set of criteria in addition to the first event and outputs signal when the second set of criteria is met. In other examples, using the multiple detection low power hardware to pre-process information using very low power processing offloads the MCU from waking up to process information to save overall power for the system.

In other embodiments, a process may include a first MEMS sensor, as described above, comparing (e.g. subtracting) successive sensed data, and determining whether the difference exceeds a threshold. If so, the first MEMS sensor generates an interrupt signal and wakes an MCU, the MCU processes the sensed data to determine whether the sensed data possibly indicates a seismic event or not. If not, the MCU returns to sleep, and the first MEMS sensor continues its monitoring loop.

In various embodiments, if the MCU determines that the sensed data might indicate a seismic event, one or more additional MEMS sensor is powered up. The one or more MEMS sensor may measure different types of parameter than the first MEMS sensor (e.g. tilt or pressure versus acceleration; heat or noise versus tilt; etc.). In various embodiments, the one or more MEMS sensor may provide sensed data over multiple number of successive readings. Based upon the sensed data, the MCU may perform multiple threshold comparisons with respect time (e.g. tilt amount, acceleration direction, acceleration amplitude, and the like) to determine whether the physical perturbations should be associated with a utility shut-off event.

Some representative claims:

1. A system of single or multiple sensors that evaluate criteria for a set of events and upon meeting all the criteria, wake up system components such as MCU or processor to process data. This system achieves ultra-low power consumption by keeping the higher power consumption components in the system to be used for a minimal duration 2. Single sensor that is capable of verifying multiple different criteria or events and generates output signals to communicate with other components 3. System in 2 that generates a first signal upon detection of first event and a second signal upon detection of another occurrence of same event or a different event 4. System in 2 that uses on chip or external hardware that performs combinatorial functions based upon multiple signals output from a sensor 5. System in 2 where the generated signal is interrupt 6. System of 2 or more sensors, a processor or MCU to detect occurrences of multiple events, where the sensors substantially use low power to detect certain events and wake up processor only upon meeting desired criteria.

7. System in 6, where a first sensor detects first event and only after detection wakes up next sensor to process detection of second event 8. System in 6, where the processor or any higher power consuming component is powered in wake mode after sequential detection of multiple events by multiple sensors 9. System in 6 where the event is earthquake event and first sensor detects tilt and second sensor detects free fall 10. A system of single or multiple sensors that evaluate criteria for a set of events and upon meeting all the criteria and generating signals upon successful detection, an on-chip or external to chip circuit that processes the generated signal to perform certain logic or combinatorial processing and after the processed signal meets certain logic, wakes up system components such as MCU or processor to process data 11. System in 10 where the sensors stores set of multiple data so that upon waking up processor, all the stored data is transferred & processed by processor.

Further embodiments can be envisioned to one of ordinary skill in the art after reading this disclosure. In other embodiments, combinations or sub-combinations of the above disclosed invention can be advantageously made. For example, embodiments of the present invention may be used to shut-off powered-devices (e.g. elevators, escalators, assembly line robots, autonomous vehicles, trains, and the like). The block diagrams of the architecture and flow charts are grouped for ease of understanding. However, it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

We claim:

1. A system coupled to a utility shut-off mechanism comprising:
 a MEMS device configured to receive one or more first physical perturbations and to output first sensed signals in response thereto, wherein the MEMS device is configured to receive one or more second physical perturbations and to output second sensed signals in response thereto, wherein the MEMS device is configured to determine whether the first physical perturbations exceed a first threshold, and wherein the MEMS device is configured to determine whether the second physical perturbations exceed a second threshold in response to the one or more first physical perturbations exceeding the first threshold;
 a memory coupled to the MEMS device and configured to store the first sensed signals and the second sensed signals;
 a processor coupled to MEMS device and to the memory, wherein the processor comprises a low power consumption state and a high power consumption state, wherein the processor is configured to determine a seismic event condition in response to the first sensed signals and to the second sensed signals and in response to the one or more second physical perturbations exceeding the second threshold, wherein the processor is configured to direct the utility shut-off mechanism to activate in response to the seismic event condition; and
 wherein the processor is configured to be in the low power consumption state before the MEMS device determines that the one or more second physical perturbations exceed the second threshold; and
 wherein the processor is configured to be in the high power consumption state after the MEMS device determines that the one or more second physical perturbations exceed the second threshold.

2. The system of claim 1 wherein the utility shut-off mechanism is selected from a group consisting of: natural gas shut-off, water shut-off, electricity shut-off, petroleum shut-off, propane shut-off.

3. The system of claim 1 wherein the first physical perturbations comprise a device tilt and the first threshold comprises a tilt threshold; and
 wherein the second physical perturbations comprise an acceleration and the second threshold comprises an acceleration threshold.

4. The system of claim 1 wherein the MEMS device is in a first power consumption state associated with determining whether the one or more first physical perturbations exceed the first threshold;
 wherein the MEMS device is in a second power consumption state associated with determining whether the one or more second physical perturbations exceed the second threshold; and
 wherein the second power consumption state of the MEMS device is higher than the first power consumption state of the MEMS device.

5. The system of claim 1 wherein the MEMS device comprises a first MEMS accelerometer and a second MEMS accelerometer;
 wherein the first MEMS accelerometer is configured to receive the one or more first physical perturbations and to output the first sensed signals in response thereto;
 wherein the second MEMS accelerometer is configured to receive the one or more second physical perturbation and to output the second sensed signals in response thereto; and wherein the second MEMS accelerometer is configured to be in a low power consumption state before the first MEMS accelerometer determines that the one or more first physical perturbations exceed the first threshold; and
 wherein the second MEMS accelerometer is configured to be in a high power consumption state after the first MEMS accelerometer determines that the one or more first physical perturbation exceed the first threshold.

6. The system of claim 1 wherein the first MEMS device is configured to determine whether the first physical perturbations exceed the first threshold by being configured to compare a difference between successive sensed signals from the first sensed signals to the first threshold.

7. The system of claim 1 further comprising a wireless communication module coupled to the processor, wherein the wireless communication module is configured to transmit data to a remote server, wherein the data is selected from a first group consisting of: an indication of the seismic event condition, and a service address associated with the system.

8. The system of claim 7 wherein the communication module is selected from a group consisting of: Wi-Fi, cellular, Ethernet, Bluetooth, Z-wave, Zig-Bee, a mesh network.

9. The system of claim 1 wherein the first MEMS device is configured to determine whether the first physical perturbations exceed the first threshold by being configured to compare each sensed signal from the first sensed signals to the first threshold.

10. The system of claim 9 wherein the first MEMS device is configured to determine whether the first physical perturbations exceed the first threshold when a majority of sensed signals from the first sensed signals exceeds the first threshold.

11. A method for a system coupled to a utility shut-off mechanism comprises:
 applying operating power to a MEMS device while inhibiting operating power from being supplied to at least a portion of a processor;
 receiving with the MEMS device one or more first physical perturbations and outputting first sensed signals in response thereto;
 determining with the MEMS device whether the first sensed signals exceed a first threshold;
 receiving with MEMS device one or more second physical perturbations and outputting second sensed signals in response thereto;
 determining with the MEMS device whether the second sensed signals exceed a second threshold;
 storing in a memory the first sensed signals and the second sensed signals;
 applying the operating power to the portion of the processor in response to the second sensed signals exceeding the second threshold;
 processing with the portion of the processor the first sensed signals and the second sensed signals and determining a seismic event condition in response thereto; and
 directing with the portion of the processor the utility shut-off mechanism to activate in response to the seismic event condition,
 wherein the processor is configured to be in a low power consumption state before the MEMS device determines that the one or more second physical perturbations exceed the second threshold; and
 wherein the processor is configured to be in a high power consumption state after the MEMS device determines that the one or more second physical perturbations exceed the second threshold.

12. The method of claim 11 wherein the utility shut-off mechanism is selected from a group consisting of: natural gas shut-off, water shut-off, electricity shut-off, petroleum shut-off, and propane shut-off.

13. The method of claim 11 wherein the first physical perturbations comprise a device tilt and the first threshold comprises a tilt threshold; and
wherein the second physical perturbations comprise an acceleration and the second threshold comprises an acceleration threshold.

14. The method of claim 11 further comprising:
inhibiting the operating power from being applied to the portion of the processor before the second sensed signals exceed the second threshold;
wherein the MEMS device is in a first power consumption state associated with determining whether the first physical perturbation exceeds the first threshold;
wherein the MEMS device is in a second power consumption state associated with determining whether the second physical perturbations exceed the second threshold; and
wherein the second power consumption state of the MEMS device is higher than the first power consumption state of the MEMS device.

15. The method of claim 11
wherein the MEMS device comprises a first MEMS accelerometer and a second MEMS accelerometer;
wherein the receiving with the MEMS device the first physical perturbation comprises receiving with the first MEMS accelerometer the first physical perturbations;
wherein the receiving with the MEMS device the second physical perturbation comprises receiving with the second MEMS accelerometer the second physical perturbations.

16. The method of claim 11 wherein the determining with the MEMS device whether the first sensed signals exceed the first threshold comprises comparing with the MEMS device differences between successive sensed signals from the first sensed signals to the first threshold.

17. The method of claim 11 further comprising communicating with a communication module data to a remote server, wherein the data is selected from a group consisting of: an indication of the seismic event condition, a service address associated with the utility shut-off mechanism.

18. The method of claim 17 wherein the communication module is selected from a group consisting of: Wi-Fi, cellular, Ethernet, Bluetooth, Z-wave, Zig-Bee, a mesh network.

19. The method of claim 11 wherein the determining with the MEMS device whether the first sensed signals exceed the first threshold comprises comparing with the MEMS device each sensed signal from the first sensed signals to the first threshold.

20. The method of claim 19 further comprising determining with the MEMS device whether the first sensed signals exceed the first threshold when a majority of sensed signals from the first sensed signals exceeds the first threshold.

* * * * *